United States Patent
Lee et al.

(10) Patent No.: US 8,175,300 B2
(45) Date of Patent: May 8, 2012

(54) MICRO-ELECTROMECHANICAL SYSTEMS (MEMS) MICROPHONE AND METHOD OF MANUFACTURING THE SAME

(75) Inventors: Jae Woo Lee, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 326 days.

(21) Appl. No.: 12/509,411

(22) Filed: Jul. 24, 2009

(65) Prior Publication Data

US 2010/0158281 A1    Jun. 24, 2010

(30) Foreign Application Priority Data

Dec. 22, 2008  (KR) .................. 10-2008-0131632

(51) Int. Cl.
*H04R 25/00*    (2006.01)
(52) U.S. Cl. ..................... 381/175; 381/191
(58) Field of Classification Search .............. 381/113, 381/116, 173–176, 191
See application file for complete search history.

(56) References Cited

U.S. PATENT DOCUMENTS

| 5,573,679 | A | 11/1996 | Mitchell et al. |
| 7,146,016 | B2* | 12/2006 | Pedersen ............... 381/175 |
| 2006/0134904 | A1 | 6/2006 | Araki et al. |
| 2007/0201710 | A1 | 8/2007 | Suzuki et al. |
| 2009/0016550 | A1 | 1/2009 | Qiao |

FOREIGN PATENT DOCUMENTS

| JP | 2006-270408 | 10/2006 |
| KR | 1020060099627 A | 9/2006 |
| KR | 1020080052222 A | 6/2008 |
| KR | 1020080109001 A | 12/2008 |
| KR | 1020090029362 A | 3/2009 |
| KR | 1020090054885 A | 6/2009 |

OTHER PUBLICATIONS

Alfons Dehé, "Silicon microphone development and application," Sensors and Actuators, 2006, pp. 283-287, Elsevier B.V.

* cited by examiner

*Primary Examiner* — Suhan Ni

(57) ABSTRACT

Provided are a micro-electromechanical systems (MEMS) microphone and a method of manufacturing the same. A manufacturing process is simplified compared to a conventional art using both upper and lower substrate processes. Since defects which may occur during manufacturing are reduced due to the simplified manufacturing process, the manufacturing throughput is improved, and since durability of the MEMS microphone is improved, system stability against the external environment is improved.

9 Claims, 7 Drawing Sheets

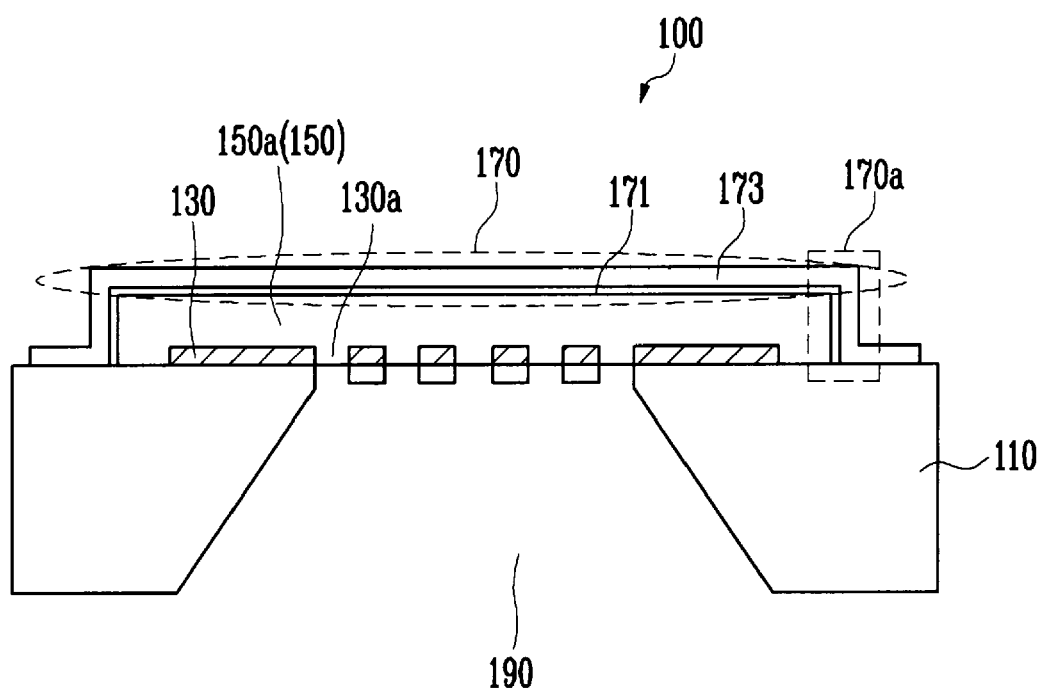

MICRO-ELECTROMECHANICAL SYSTEMS (MEMS) MICROPHONE AND METHOD OF MANUFACTURING THE SAME

CROSS-REFERENCE TO RELATED APPLICATION

This application claims priority to and the benefit of Korean Patent Application No. 10-2008-0131632, filed Dec. 22, 2008, the disclosure of which is incorporated herein by reference in its entirety.

BACKGROUND

1. Field of the Invention

The present invention relates to a micro-electromechanical systems (MEMS) microphone and a method of manufacturing the same, and more particularly to a MEMS microphone which can be simply manufactured through an upper substrate process and a method of manufacturing the same.

2. Discussion of Related Art

A microphone is an apparatus which converts a voice into an electrical signal. Types of microphones include a dynamic type, a condenser type, a ribbon type, and a ceramic type. As electrical or electronic technology develops rapidly, microphone technology is also greatly improved, and as development of small-sized wireless or wire line devices is accelerated, the size of microphones is also gradually decreasing. In this regard, a micro-electromechanical systems (MEMS) microphone using MEMS technology has been recently developed.

MEMS microphones can be generally divided into a piezo type and a condenser type. The condenser-type MEMS microphone is more frequently used due to an excellent frequency response characteristic of a voice band.

FIG. 1 illustrates a conventional condenser-type MEMS microphone.

Referring to FIG. 1, a condenser-type MEMS microphone 100 is manufactured by an upper substrate process of forming a lower electrode 130 and a diaphragm 170 in an upper portion of a substrate 110 and a lower substrate process of forming a rear acoustic chamber 190 in a lower portion of the substrate 110.

First, in the upper substrate process, the lower electrode 130 is formed on the substrate 110, and a sacrificial layer-removing lower electrode hole 130a is formed in the lower electrode 130. A sacrificial layer 150 is formed on the lower electrode 130 at a predetermined thickness, and the diaphragm 170 is formed on the sacrificial layer 150. The diaphragm 170 includes an insulating layer 171 and an upper electrode 173, and is fixed to the substrate 110 by a diaphragm support 170a.

Next, in the lower substrate process, after the diaphragm 170 is formed on the substrate 110, the upper portion of the substrate 110 is protected by an insular, and a lower portion of the substrate 110 is etched through bulk-type micromachining to form a rear acoustic chamber 190. Then, the sacrificial layer 150 is removed through the lower electrode hole 130a to form a vibration cavity 150a.

As described above, according to the conventional art, since the lower substrate process is required in order to form the rear acoustic chamber 190, the manufacturing process is complicated. Therefore, there is a problem in that there is a limitation to increasing manufacturing throughput.

SUMMARY OF THE INVENTION

The present invention is directed to a MEMS microphone which can be simply manufactured through an upper substrate process and a method of manufacturing the same.

One aspect of the present invention provides a micro-electromechanical systems (MEMS) microphone, including: a substrate; a rear acoustic chamber formed inside the substrate; a lower electrode formed above the substrate and including first and second rear acoustic chamber vent holes through which the rear acoustic chamber is formed; and a diaphragm formed to have a vibration cavity between with the lower electrode and including a side hole for removing a sacrificial layer to form the vibration cavity.

The rear acoustic chamber may have a well-shaped cross section.

A lower insulating layer may be formed between the lower electrode and the substrate.

The first rear acoustic chamber vent hole may be formed to penetrate the lower electrode and the lower insulating layer inside the lower electrode, the second rear acoustic chamber vent hole may be formed to extend from the inside of the lower electrode to the outside and penetrate the lower electrode and the lower insulating layer, and a predetermined surface portion of the substrate may be exposed by the first and second rear acoustic chamber vent holes.

The diaphragm may be fixed to the substrate by a diaphragm support which is formed such that a predetermined portion of the diaphragm extends to the substrate.

The side hole may be an empty space between the diaphragm supports.

The side hole may be formed at a location corresponding to the second rear acoustic chamber vent hole.

A lower electrode support which supports the lower electrode may be formed inside the substrate.

An attenuation coefficient may be adjusted depending on the size and number of the first and second rear acoustic chamber vent holes.

Another aspect of the present invention provides a method of manufacturing a micro-electromechanical systems (MEMS) microphone, the method including: sequentially forming a lower insulating layer and a lower electrode on a substrate; etching portions of the lower insulating layer and the lower electrode to form first and second rear acoustic chamber vent holes through which a rear acoustic chamber is formed; forming a sacrificial layer on the lower electrode; forming a diaphragm including a diaphragm support and a side hole for removing the sacrificial layer on the sacrificial layer; etching the sacrificial layer through the side hole to form a vibration cavity; and etching the inside of the substrate at a predetermined depth through the first and second rear acoustic chamber vent holes to form the rear acoustic chamber.

Sequentially forming the lower insulating layer and the lower electrode may include forming the lower insulating layer on the substrate, and then forming the lower electrode on a central portion of the lower insulating layer.

Etching the portions of the lower insulating layer and the lower electrode may include forming the first and second rear acoustic chamber vent holes to penetrate the lower insulating layer and the lower electrode while exposing predetermined surface portions of the substrate.

Etching the portions of the lower insulating layer and the lower electrode may include: forming the first rear acoustic chamber vent hole which penetrates the lower insulating layer and the lower electrode inside the lower electrode; and forming the second rear acoustic chamber vent hole which extends from the inside of the lower electrode to the outside and penetrates the lower insulating layer and the lower electrode.

Forming the diaphragm may include forming a diaphragm support in which a predetermined portion of the diaphragm extends to the substrate while forming the side hole in an empty space between with the diaphragm support.

Forming the diaphragm may include forming the side hole at a location corresponding to the second rear acoustic chamber vent hole.

Etching the sacrificial layer may include etching the sacrificial layer through the side hole using a surface micromachining process technique to form the vibration cavity.

Etching the inside of the substrate may include etching the inside of the substrate at a predetermined depth centering on the first and second rear acoustic chamber vent holes using a surface micromachining process technique or a dry-etching technique to form the rear acoustic chamber.

The inside of the substrate may be etched through the first and second rear acoustic chamber vent holes so that the rear acoustic chamber has a well-shaped cross section.

A lower electrode support which supports the lower electrode may be formed inside the substrate by etching the inside of the substrate through the first and second rear acoustic chamber vent holes.

An attenuation coefficient of the diaphragm may be adjusted by adjusting the size and number of the first and second rear acoustic chamber vent holes.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 1 is a cross-sectional view illustrating a conventional condenser-type MEMS microphone;

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 2A:
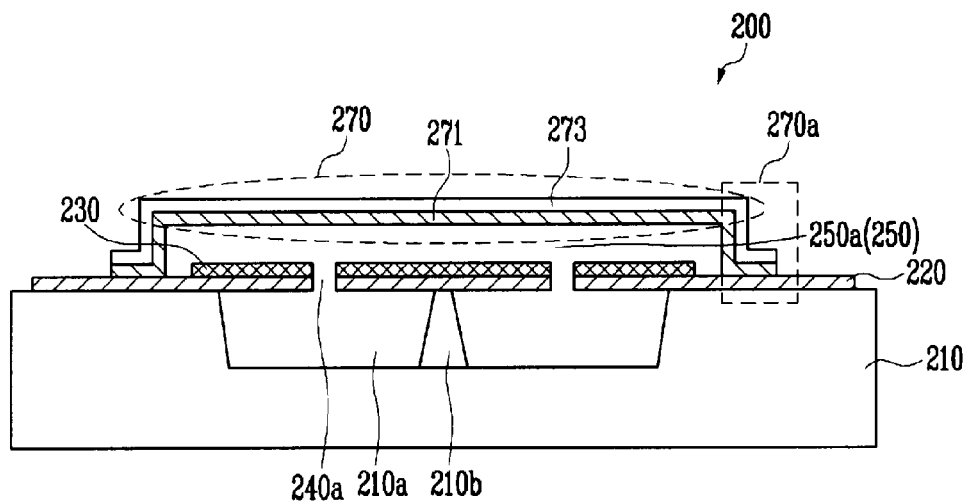
FIGS. 2A and 2B are cross-sectional views illustrating a structure of a MEMS microphone according to an exemplary embodiment of the present invention.
Figure 2B:
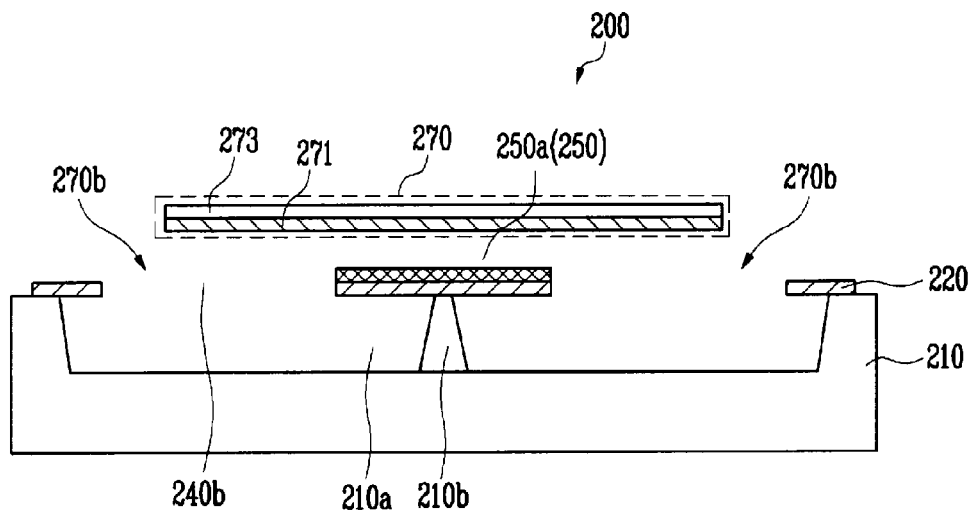

FIGS. 2A and 2B are cross-sectional views, taken at different angles, illustrating a structure of a micro-electromechanical systems (MEMS) microphone 200 according to an exemplary embodiment of the present invention.

Referring to FIGS. 2A and 2B, the MEMS microphone 200 according to an exemplary embodiment of the present invention includes a substrate 210 in which a rear acoustic chamber 210a and a lower electrode support 210b are formed, a lower insulating layer 220 formed on the substrate 210, a lower electrode 230 formed on a central portion of the lower insulating layer 220, and a diaphragm 270 formed above the lower electrode 230 with a vibration cavity 250a therebetween.

Particularly, the rear acoustic chamber 210a having a well-shaped cross section and the lower electrode support 210b for supporting the lower electrode 230 are formed inside the substrate 210, and first and second rear acoustic chamber vent holes 240a and 240b through which the rear acoustic chamber 210a is formed are formed above the rear acoustic chamber 210a.

The first and second rear acoustic vent holes 240a and 240b serve not only to form the rear acoustic chamber 210a but also to improve an attenuation coefficient of the diaphragm 270 to thereby improve a frequency response characteristic.

That is, in the conventional condenser-type MEMS microphone 100, the rear acoustic chamber 190 is formed in the lower portion of the substrate 110, but in the MEMS microphone 200 according to an exemplary embodiment of the present invention, the rear acoustic chamber 210a is formed inside the substrate 210.

The rear acoustic chamber 210a can be formed inside the substrate 210 because a sacrificial layer 250 can be etched through a sacrificial layer-removing side hole 270b formed on a predetermined side of the diaphragm 270, which will be described below in further detail.

A method of manufacturing the MEMS microphone 200 according to an exemplary embodiment of the present invention will be described below in further detail.

FIGS. 3A to 3K are cross-sectional views illustrating a method of manufacturing the MEMS microphone 200 according to an exemplary embodiment of the present invention.

Figure 3A:
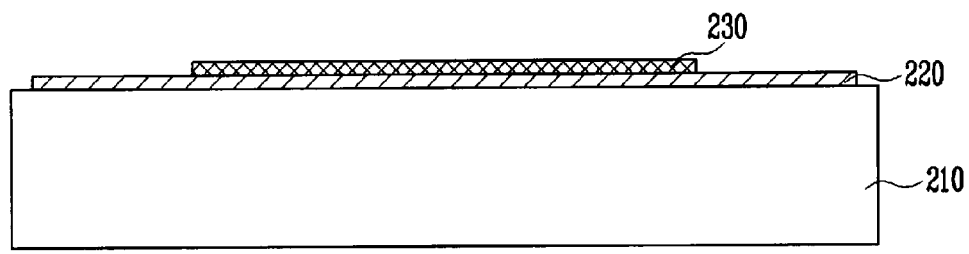
FIGS. 3A to 3K are cross-sectional views illustrating a method of manufacturing a MEMS microphone according to an exemplary embodiment of the present invention.

First, as shown in FIG. 3A, the lower insulating layer 220 is formed on the substrate 210, and the lower electrode 230 is formed on a central portion of the lower insulating layer 220.

Figure 3B:
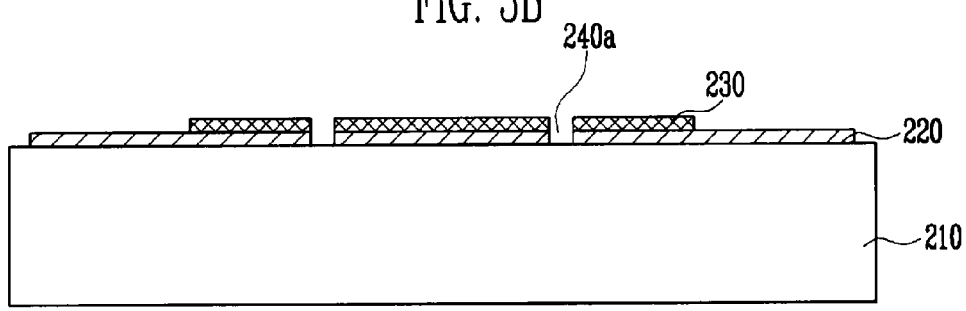
Figure 3C:
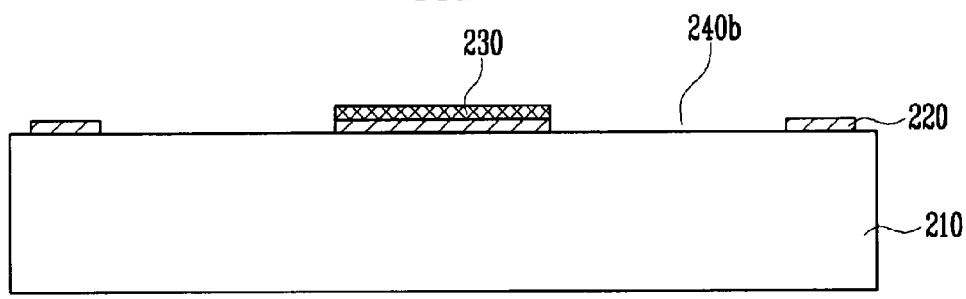

Then, as shown in FIGS. 3B and 3C, the first and second rear acoustic chamber vent holes 240a and 240b are formed to penetrate the lower electrode 230 and the lower insulating layer 220.

The first and second area acoustic chamber vent holes 240a and 240b are holes used to etch the inside of the substrate in order to form the rear acoustic chamber 210a and will be described below in further detail with reference to FIG. 4.

Figure 4:
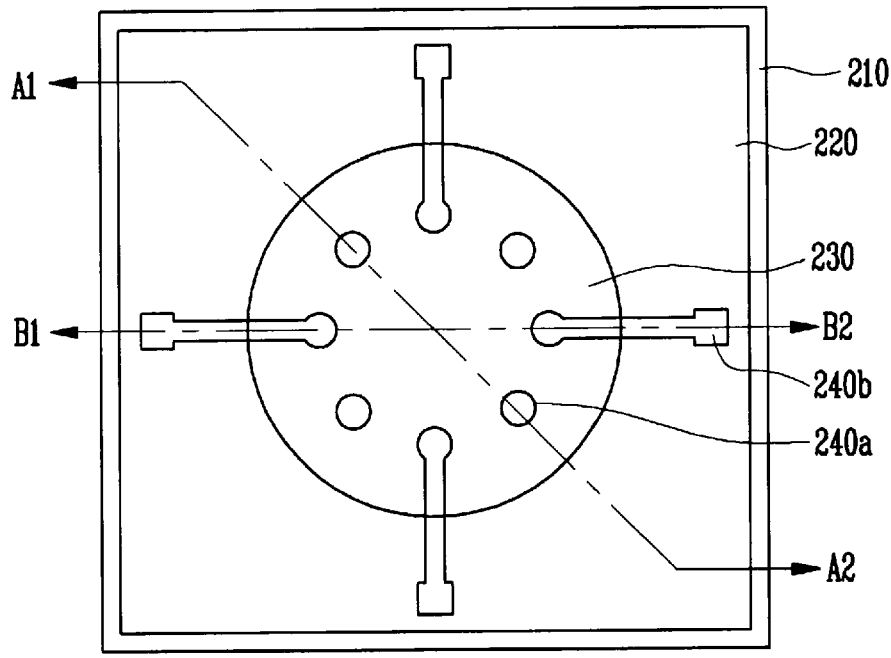
FIG. 4 is a view for describing first and second rear acoustic vent holes through which a rear acoustic chamber is formed in a MEMS microphone according to an exemplary embodiment of the present invention.

FIG. 4 is a view for describing the first and second rear acoustic vent holes 240a and 240b through which the rear acoustic chamber 210a is formed in the MEMS microphone 200 according to an exemplary embodiment of the present invention. FIG. 3B is a cross-sectional view taken along line A1-A2 of FIG. 4, and FIG. 3C is a cross-sectional view taken along line B1-B2 of FIG. 4.

Referring to FIG. 4, a predetermined number of the first and second rear acoustic vent holes 240a and 240b which penetrate the lower electrode 230 and the lower insulating layer 220 are formed at a predetermined interval.

The first rear acoustic chamber vent hole 240a is formed inside the lower electrode 230 to expose a predetermined surface portion of the substrate 210, and the second rear acoustic chamber vent hole 240b is formed to extend from the inside of the lower electrode 230 to the outside thereof to expose a predetermined surface portion of the substrate 210.

The second rear acoustic chamber vent hole 240b is formed to extend to the outside of the lower electrode 230 so that the inside of the substrate 210 can be more easily etched and processed when forming the rear acoustic chamber 210a.

Since an attenuation coefficient of the diaphragm 270 which will be formed later may depend on the size and number of the first and second rear acoustic chamber vent holes 240a and 240b, the attenuation coefficient of the diaphragm 270 may be adjusted by adjusting the size and number of the first and second rear acoustic chamber vent holes 240a and 240b to thereby improve the frequency response characteristic.

Figure 3D:
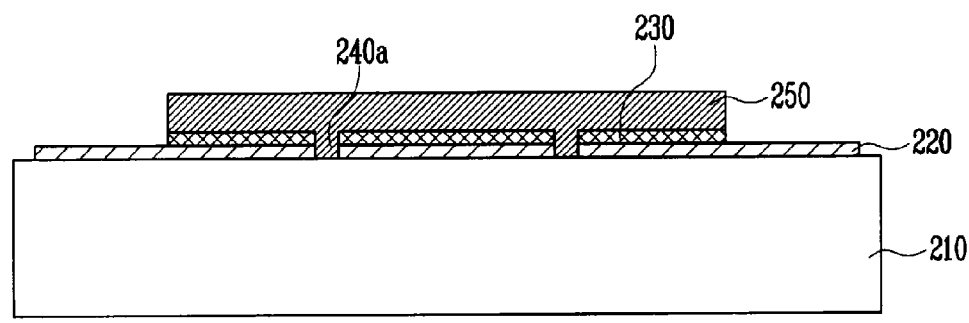

Next, as shown in FIG. 3D, the sacrificial layer 250 is formed on the substrate 210 on which the lower insulating layer 220 and the lower electrode 230 are sequentially stacked.

Figure 3E:
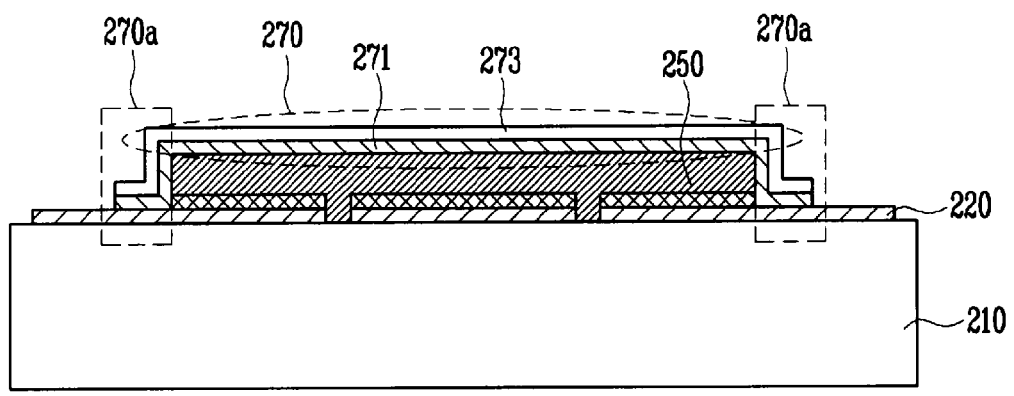
Figure 3F:
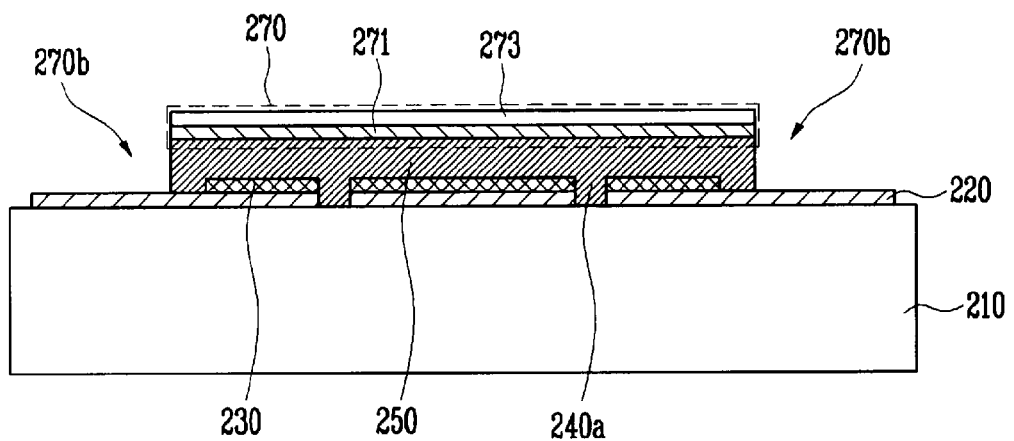
Figure 3G:
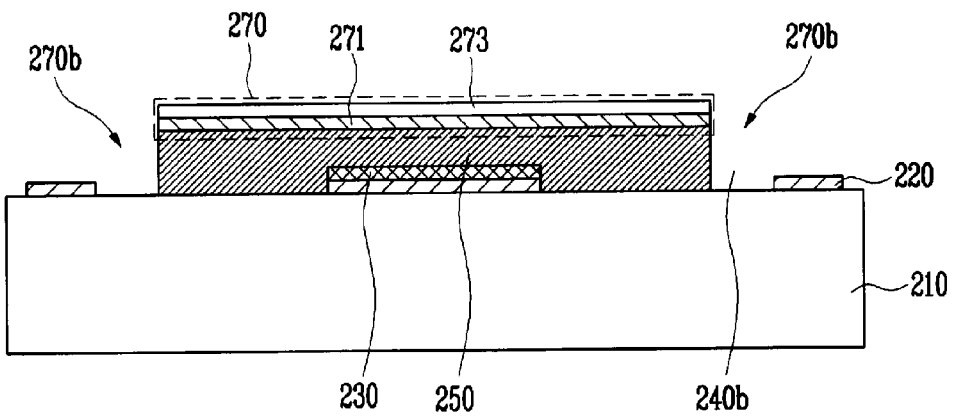

Subsequently, as shown in FIGS. 3E to 3G, an insulating layer 271 and an upper electrode 273 are sequentially stacked on the sacrificial layer 250 to form the diaphragm 270.

At this time, the diaphragm support 270a for fixing the diaphragm 270 to the substrate 210 and the sacrificial layer-removing side hole 270b for etching of the sacrificial layer 250 are formed together.

The diaphragm support 270a is formed such that the diaphragm 270 extends to the substrate along the side of the sacrificial layer 250. At this time, an area in which the diaphragm 270 does not extend to the substrate 210 is defined as the sacrificial layer-removing side hole 270b.

The diaphragm support 270a and the sacrificial layer-removing side hole 270b will be described below in further detail with reference to FIG. 5.

Figure 5:
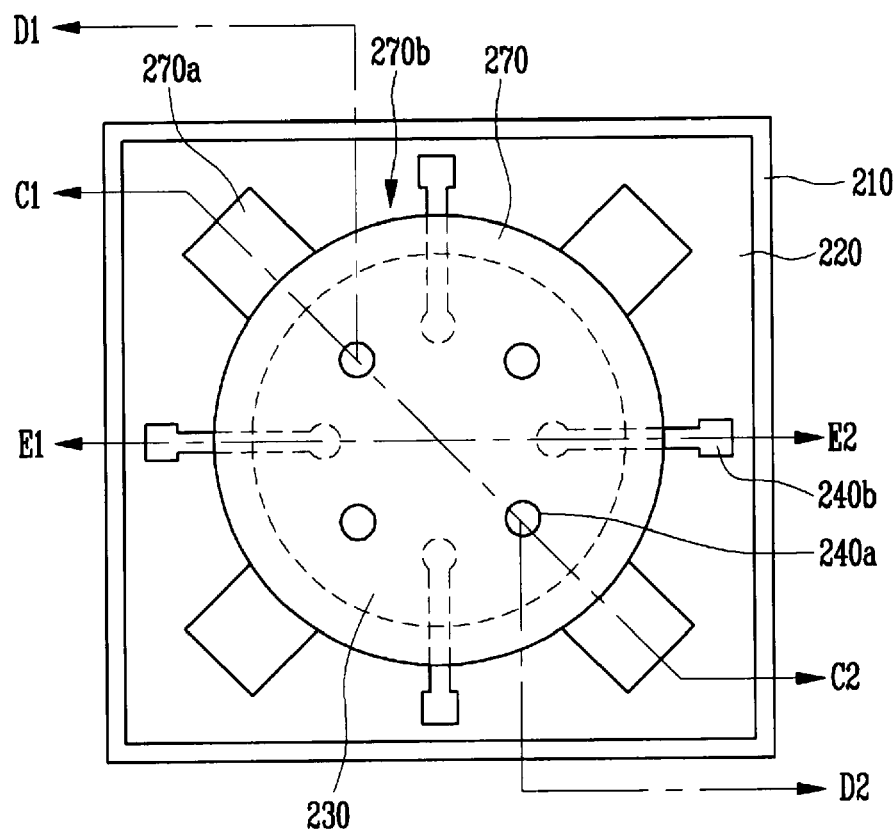
FIG. 5 is a view for describing a diaphragm including a diaphragm support and a sacrificial layer-removing side hole in a MEMS microphone according to an exemplary embodiment of the present invention.

FIG. 5 is a view for describing the diaphragm 270 including the diaphragm support 270a and the sacrificial layer-removing side hole 270b in the MEMS microphone 200 according to an exemplary embodiment of the present invention. FIG. 3E is a cross-sectional view taken along line C1-C2 of FIG. 5, FIG. 3F is a cross-sectional view taken along line D1-D2 of FIG. 5, and FIG. 3G is a cross-sectional view taken along line E1-E2 of FIG. 5.

Referring to FIG. 5, the diaphragm support 270a extends to the substrate 210 to fix the diaphragm 270 to the substrate 210, and an empty space between the diaphragm supports 270a, that is, an area in which the diaphragm support 270a is not formed, serves as the sacrificial layer-removing side hole 270b.

The sacrificial layer-removing side hole 270b is preferably formed at a location corresponding to the second rear acoustic chamber vent hole 240b. This is because the inside of the substrate 210 can be more easily etched and processed when forming the rear acoustic chamber 210.

Figure 3H:
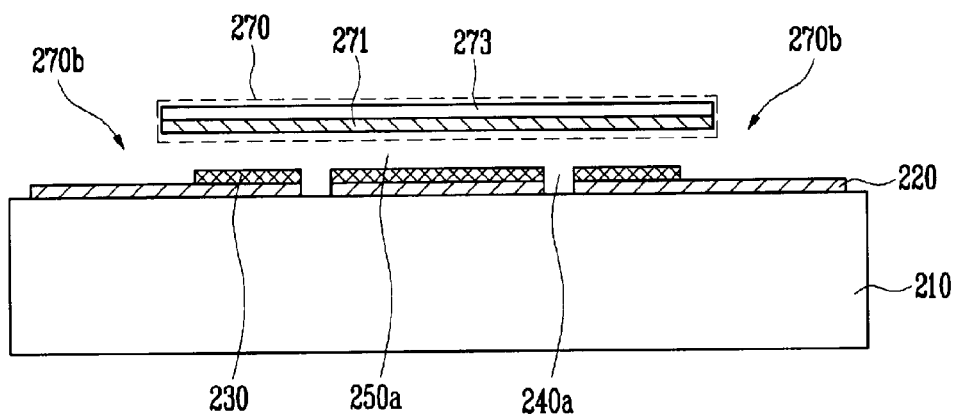
Figure 3I:
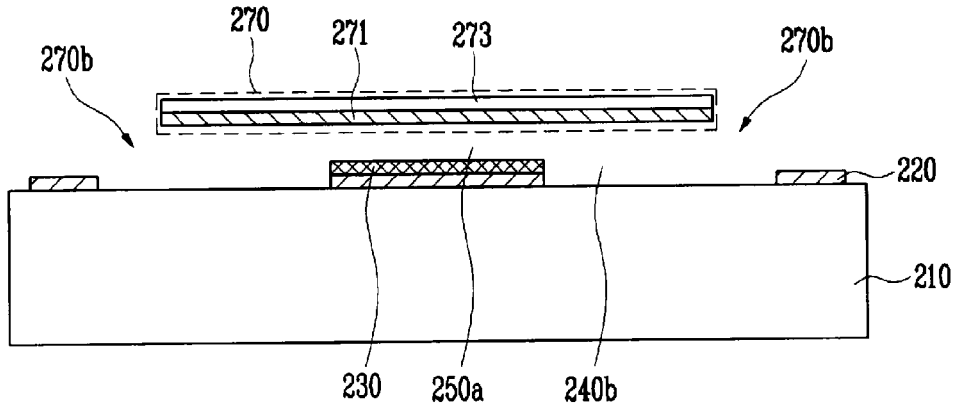

Then, the sacrificial layer 250 is removed through the sacrificial layer-removing side hole 270a using a surface micromachining process (see FIGS. 3F and 3G) to thereby form the vibration cavity 250a in which the diaphragm 270 can freely vibrate as shown in FIGS. 3H and 3I.

Also, through the process described above, as shown in FIGS. 3H and 3I, the first and second rear acoustic chamber vent holes 240a and 240b for forming the rear acoustic chamber 210a are exposed.

Figure 3J:
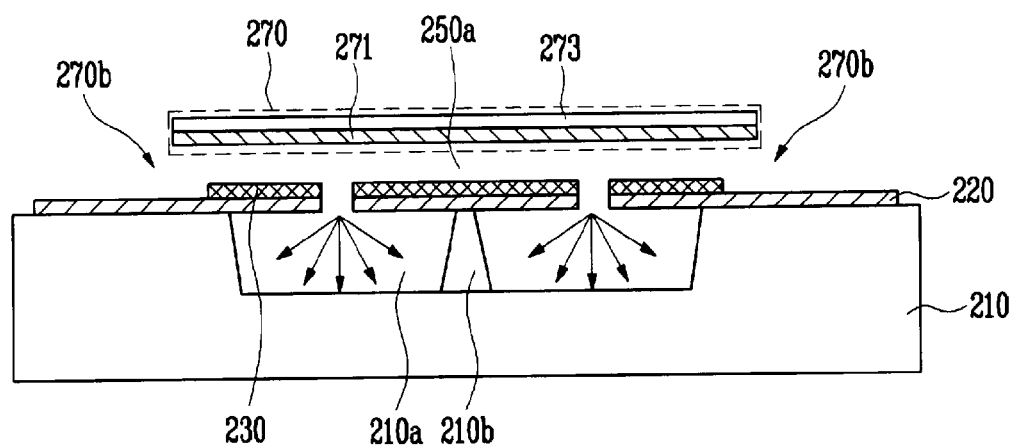
Figure 3K:
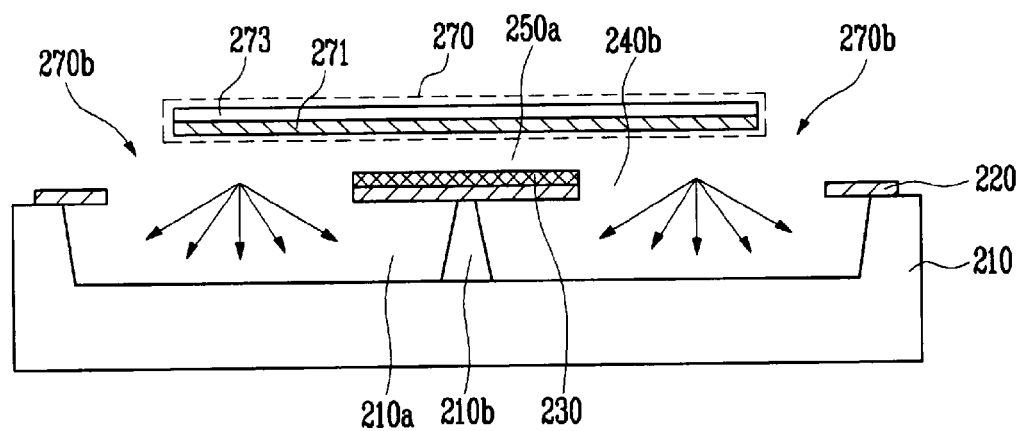

Finally, as shown in FIGS. 3J and 3K, the inside of the substrate 210 corresponding to the first and second rear acoustic chamber vent holes 240a and 240b is etched using a surface micromachining process to thereby form the rear acoustic chamber 210a which has a well-shaped cross section inside the substrate 210.

At this time, as shown in FIGS. 3J and 3K, since the side is opened through the sacrificial layer-removing side hole 270b, the inside of the substrate 210 can be easily etched through the first and second rear acoustic chamber vent holes 240a and 240b. Particularly, since the width of the second rear acoustic chamber vent hole 240b is wider than the width of the first rear acoustic chamber vent hole 240a, the inside of the substrate 210 can be more easily etched through the second rear acoustic chamber vent hole 240b.

As the inside of the substrate 210 is etched through the first and second rear acoustic chamber vent holes 240a and 240b, a lower electrode support 210b for supporting the lower electrode 230 is formed inside the substrate 210.

The size of the rear acoustic chamber 210a formed through the process described above depends on the overall area size of the lower electrode 230 which detects a variation of capacitance, and the depth thereof depends on the maximum depth at which the lower electrode support 210b which supports the lower electrode 230 at a regular interval can be formed.

In the present embodiment, the rear acoustic chamber 210a is formed through the first and second rear acoustic chamber vent holes 240a and 240b using a surface micromachining process, but the rear acoustic chamber 210a may be formed using a dry-etching technique without a separate mask process.

As described above, according to the conventional art, the lower substrate process is indispensably required in order to form the rear acoustic chamber 190, but according to an exemplary embodiment of the present invention, the rear acoustic chamber 210a can be simply manufactured only through the upper substrate process using the first and second rear acoustic chamber vent holes 240a and 240b.

As described above, according to the present invention, since the MEMS microphone can be manufactured only through the upper substrate process, the manufacturing process can be simplified compared to the conventional art using both the upper substrate process and the lower substrate process, and defects which may occur during manufacturing can be reduced, leading to high manufacturing throughput.

Also, since durability of the MEMS microphone is increased by the lower electrode support 210b, system stability against the external environment is improved, and since an attenuation coefficient of the diaphragm 270 can be improved by the first and second rear acoustic chamber vent holes 240a and 240b, the frequency response characteristic can be improved.

According to exemplary embodiments of the present invention, since the MEMS microphone can be manufactured through the upper substrate process, the manufacturing process is simple compared to the conventional art using both the upper substrate process and the lower substrate process.

Due to the simplified manufacturing process, defects which may occur during manufacturing can be reduced, leading to high manufacturing throughput. Since durability of the MEMS microphone is improved, system stability against the external environment can be also improved.

In addition, since an attenuation coefficient of a diaphragm can be improved by the rear acoustic chamber vent holes formed in the lower electrode, the frequency response characteristic can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:
1. A micro-electromechanical systems (MEMS) microphone, comprising:
   a substrate comprising a continuous lower surface;
   a rear acoustic chamber formed in the substrate over the continuous lower surface;
   a lower electrode formed over the substrate and including first and second rear acoustic chamber vent holes through which the rear acoustic chamber is formed;

a diaphragm disposed over the lower electrode so that a vibration cavity is formed between the diaphragm and the lower electrode; and a diaphragm support disposed around outer edges of the diaphragm, the diaphragm support including a side hole configured for removing a sacrificial layer to form the vibration cavity.

2. The MEMS microphone of claim 1, wherein the rear acoustic chamber has a well-shaped cross section.

3. The MEMS microphone of claim 1, further comprising a lower insulating layer between the lower electrode and the substrate.

4. The MEMS microphone of claim 3, wherein the first rear acoustic chamber vent hole is formed to penetrate the lower electrode and the lower insulating layer, the second rear acoustic chamber vent hole extends from an inner portion of the lower electrode to an outer portion of the lower electrode and penetrates the lower electrode and the lower insulating layer, and a predetermined surface portion of the substrate is exposed by the first and second rear acoustic chamber vent holes.

5. The MEMS microphone of claim 1, wherein the diaphragm is fixed to the substrate by a diaphragm support which is formed such that a predetermined portion of the diaphragm extends to the substrate.

6. The MEMS microphone of claim 5, wherein the side hole is an empty space between the diaphragm supports.

7. The MEMS microphone of claim 6, wherein the side hole is formed at a location corresponding to the second rear acoustic chamber vent hole.

8. The MEMS microphone of claim 1, further comprising a lower electrode support disposed over the continuous lower surface of the substrate to support the lower electrode.

9. The MEMS microphone of claim 1, wherein an attenuation coefficient is adjusted depending on the size and number of the first and second rear acoustic chamber vent holes.

* * * * *